(12) United States Patent
Suo

(10) Patent No.: US 11,812,548 B2
(45) Date of Patent: Nov. 7, 2023

(54) DISPLAY MODULE AND METHOD FOR FORMING SAME

(71) Applicant: Xiamen Tianma Micro-Electronics Co., Ltd., Xiamen (CN)

(72) Inventor: Lei Suo, Shanghai (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 88 days.

(21) Appl. No.: 17/346,718

(22) Filed: Jun. 14, 2021

(65) Prior Publication Data
US 2022/0312584 A1  Sep. 29, 2022

(30) Foreign Application Priority Data

Mar. 23, 2021  (CN) .......................... 202110306900.9

(51) Int. Cl.
*H05K 1/02* (2006.01)
*H05K 1/14* (2006.01)
*H05K 3/36* (2006.01)

(52) U.S. Cl.
CPC ........... *H05K 1/0268* (2013.01); *H05K 1/028* (2013.01); *H05K 1/14* (2013.01); *H05K 3/361* (2013.01); *H05K 2201/10128* (2013.01); *H05K 2203/16* (2013.01)

(58) Field of Classification Search
CPC ........ H05K 1/0268; H05K 1/028; H05K 1/14; H05K 3/361; H05K 2201/10128; H05K 2203/16

USPC .......................................................... 361/749
See application file for complete search history.

(56) References Cited

U.S. PATENT DOCUMENTS

| 2018/0203315 A1* | 7/2018 | Wang ................ G02F 1/136286 |
| 2020/0042125 A1* | 2/2020 | Lee ........................ G06F 3/0414 |
| 2022/0075430 A1* | 3/2022 | Im .......................... H05K 1/141 |

FOREIGN PATENT DOCUMENTS

| CN | 106658947 A | 5/2017 |
| CN | 106802816 A | 6/2017 |
| CN | 210865578 U | 6/2020 |

* cited by examiner

*Primary Examiner* — Binh B Tran
(74) *Attorney, Agent, or Firm* — ANOVA LAW GROUP PLLC

(57) ABSTRACT

A display module and its formation method are provided in the present disclosure. The display module includes a main flexible circuit board, including a first binding terminal, a second binding terminal, a first test point and a second test point, where the first test point is electrically connected to the first binding terminal, and the second test point is electrically connected to the second binding terminal; and further includes an auxiliary flexible circuit board, including a third binding terminal and a fourth binding terminal, where the third binding terminal is electrically connected to the fourth binding terminal, the first binding terminal is disposed corresponding to the third binding terminal, and the second binding terminal is disposed corresponding to the fourth binding terminal.

19 Claims, 24 Drawing Sheets

9A

9A

9B

DISPLAY MODULE AND METHOD FOR FORMING SAME

CROSS-REFERENCE TO RELATED APPLICATION

This application claims the priority of Chinese Patent Application No. 202110306900.9, filed on Mar. 23, 2021, the content of which is incorporated herein by reference in its entirety.

TECHNICAL FIELD

The present disclosure generally relates to the field of display technology and, more particularly, relates to a display module and a method for forming the display module.

BACKGROUND

In a display module, a main flexible printed circuit board (M-FPCB) may be bonded and connected to a display panel; and the M-FPCB may be used as the circuit structure of the display panel. In the existing circuit design, the circuits related to the display panel are configured on the M-FPCB. When testing the power consumption of the display module, a test line may be configured correspondingly and may need to be cut off, which may easily cause damages to the circuit around the cutting point.

SUMMARY

One aspect of the present disclosure provides a display module. The display module includes a main flexible circuit board, including a first binding terminal, a second binding terminal, a first test point and a second test point, where the first test point is electrically connected to the first binding terminal, and the second test point is electrically connected to the second binding terminal; and further includes an auxiliary flexible circuit board, including a third binding terminal and a fourth binding terminal, where the third binding terminal is electrically connected to the fourth binding terminal, the first binding terminal is disposed corresponding to the third binding terminal, and the second binding terminal is disposed corresponding to the fourth binding terminal.

Another aspect of the present disclosure provides a method for forming a display module. The method includes providing a display panel; providing a main flexible circuit board; binding to connect the main flexible circuit board with the display panel; performing a first test on the display panel and the main flexible circuit board; providing an auxiliary flexible circuit board; binding to connect the auxiliary flexible circuit board with the main flexible circuit board; and performing a second test on the main flexible circuit board and the auxiliary flexible circuit board.

Other aspects of the present disclosure can be understood by those skilled in the art in light of the description, the claims, and the drawings of the present disclosure.

BRIEF DESCRIPTION OF THE DRAWINGS

In order to more clearly explain embodiments of the present disclosure or the technical solutions in the existing technology, the drawings required for describing the embodiments or the existing technology are briefly introduced hereinafter. Obviously, the drawings in the following description are merely embodiments of the present disclosure. Other drawings may also be obtained by those skilled in the art without any creative work according to provided drawings.

DETAILED DESCRIPTION

The features and exemplary embodiments of various aspects of the present application are described in detail hereinafter. In the following detailed description, various details are described in order to provide a comprehensive understanding of the present application. However, it is obvious to those skilled in the art that the present application can be implemented without some of these details. The following description of various embodiments is merely to provide a better understanding of the present application by showing examples of the present application.

It should be noted that, in the case of no conflict, various embodiments and the features in various embodiments in the present application can be combined with each other. Various embodiments are described in detail below in conjunction with the drawings.

Relationship terms such as "first" and "second" are merely used to distinguish one entity or operation from another entity or operation, and do not necessarily require or imply any such actual relationship or order between these entities or operations. Moreover, the terms "include", "contain" or any other variations thereof are intended to cover non-exclusive inclusion, such that a process, method, article or device including a series of elements not only includes those elements, but also includes other elements that are not explicitly listed, or elements inherent to the process, method, article, or device. If there are no more restrictions, the elements defined by the sentence "include . . . " do not exclude the existence of other same elements in the process, method, article, or equipment including the elements.

It should be understood that when the structure of a component is described and a layer or region is referred to as being "on" or "above" another layer or region, it can indicate that it is directly on another layer or region, or includes other layers or regions between such layer or region and another layer or region. In addition, if the component is turned over, the layer or region may be "under" or "below" another layer or region.

Moreover, the term "and/or" in the present specification is merely an association relationship that describes associated objects, indicating that there can be three types of relationships. For example, A and/or B can indicate that there are three cases: A only, A and B, and B only. In addition, the character "/" in the present specification indicates that the associated objects in a before-after order are in an "or" relationship.

It should be understood that in various embodiments of the present application, "B corresponding to A" indicates that B is associated with A; and B can be determined according to A. However, it should also be understood that determining B based on A does not indicate that B is determined only based on A, and B can also be determined based on A and/or other information.

Figure 1:
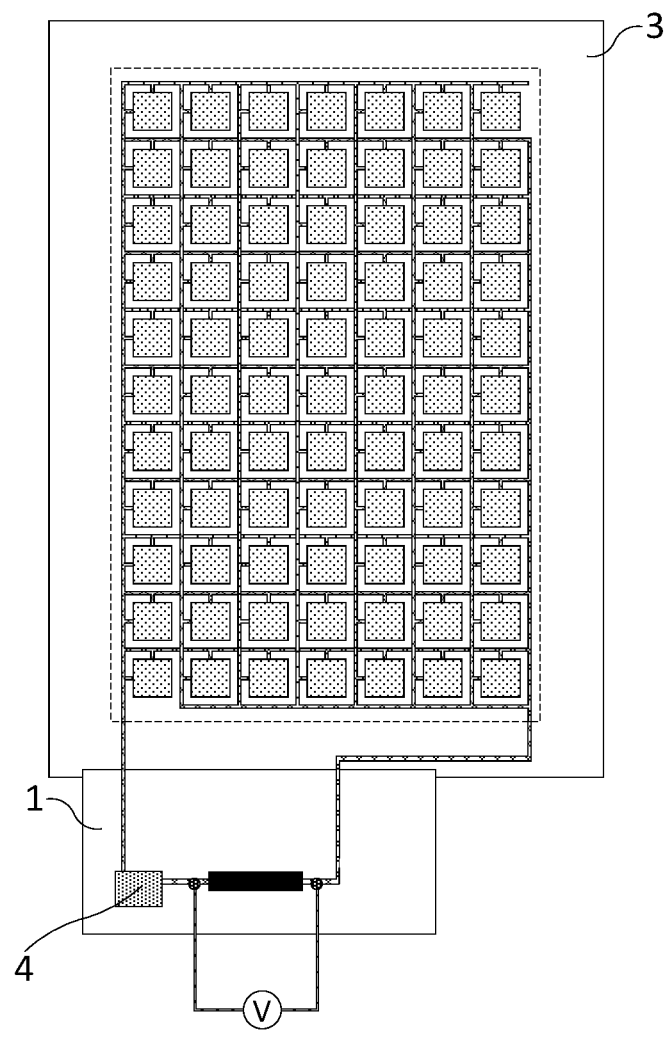
FIG. 1 illustrates a schematic of a display module in the existing technology.
Figure 2:
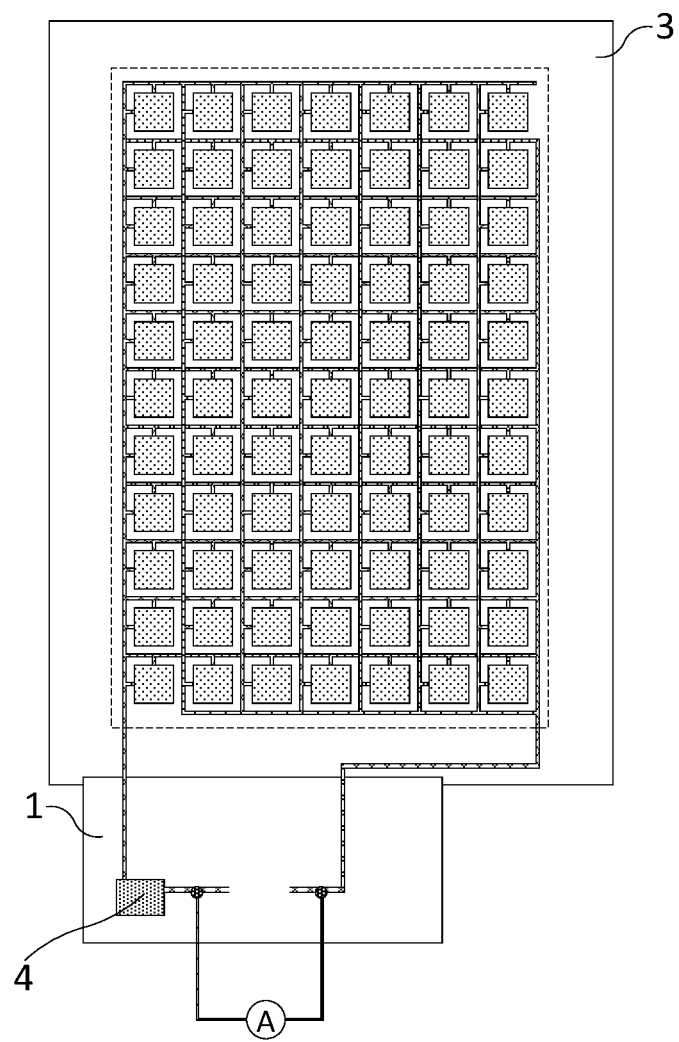
FIG. 2 illustrates a schematic of another display module in the existing technology.

The power consumption of the current display panel has become a parameter that manufacturers pay more attention to, while the conventional calculation of the power consumption has a large deviation. Therefore, a design may be performed by the inventor to test the actual power consumption of the display panel according to various embodiments of the present disclosure. FIG. 1 illustrates a schematic of a display module in the existing technology; and FIG. 2 illustrates a schematic of another display module in the existing technology.

Referring to FIG. 1, the inventor may discover that in order to detect the power consumption of a display panel 3 in the display module, after the display panel 3 is bound to be connected with a main flexible circuit board 1, a loop may be formed between a power management chip 4 of the main flexible circuit board 1 and the display panel 3; when an external power supply is provided, the display panel 3 may in operation. At this point, since the power consumption of the display panel 3 is significantly greater than the power consumption of the main flexible circuit board 1, the power consumption detection may be directly performed on the loop between the power management chip 4 and the display panel 3, and the obtained detection result may be similar to the power consumption of the display panel 3. Two implementation manners may be used to detect the power consumption of the display panel 3.

For implementation manner one, referring to FIG. 1, on the main flexible circuit board 1, a resistor may be disposed in the loop between the power management chip 4 and the display panel 3, and a voltmeter may be connected to two ends of the resistor. At this point, the power consumption W of the display panel 3 may satisfy:

$$W = \frac{U}{R} \cdot V_{pvdd},$$

where U is the voltage value measured by the voltmeter, R is the resistance value of the resistor, and $V_{pvdd}$ is the voltage of the external power supply. Such manner requires a resistor to be disposed in the loop between the power management chip 4 and the display panel 3, which may increase the impedance and power consumption of the display module.

For implementation manner two, referring to FIG. 2, on the main flexible circuit board 1, a line may be disposed in the loop between the power management chip 4 and the display panel 3, an ammeter may be connected at two ends of the line, and the line may be cut off simultaneously. At this point, the power consumption W of the display panel 3 may satisfy: $W = I \cdot V_{pvdd}$, where I is the current value measured by the ammeter and $V_{pvdd}$ is the voltage of the external power supply. Since the line needs to be cut off and the device layout of the main flexible circuit board 1 becomes more compact, such manner, with extremely high operation difficulty, may easily cause damages to the circuit around the cutting point. Moreover, it is particularly difficult to restore the connection of the panel after the test is completed. If the sampling test quantity is relatively large, a large number of products may be discarded, resulting in a declined yield.

Various embodiments of the present disclosure provide a display module. By configuring a first test point and a second test point, the test circuit may be directly connected to the first test point and the second test point, thereby implementing the parameter test of the flexible circuit board. During the power consumption test, the line on the flexible circuit board may not need to be cut off, which may avoid the damage of the flexible circuit board due to the line cutting. Furthermore, the first test strip point and the second test point may also be configured for impedance testing of the binding connection of the main flexible circuit board and the auxiliary flexible circuit board.

Figure 3:
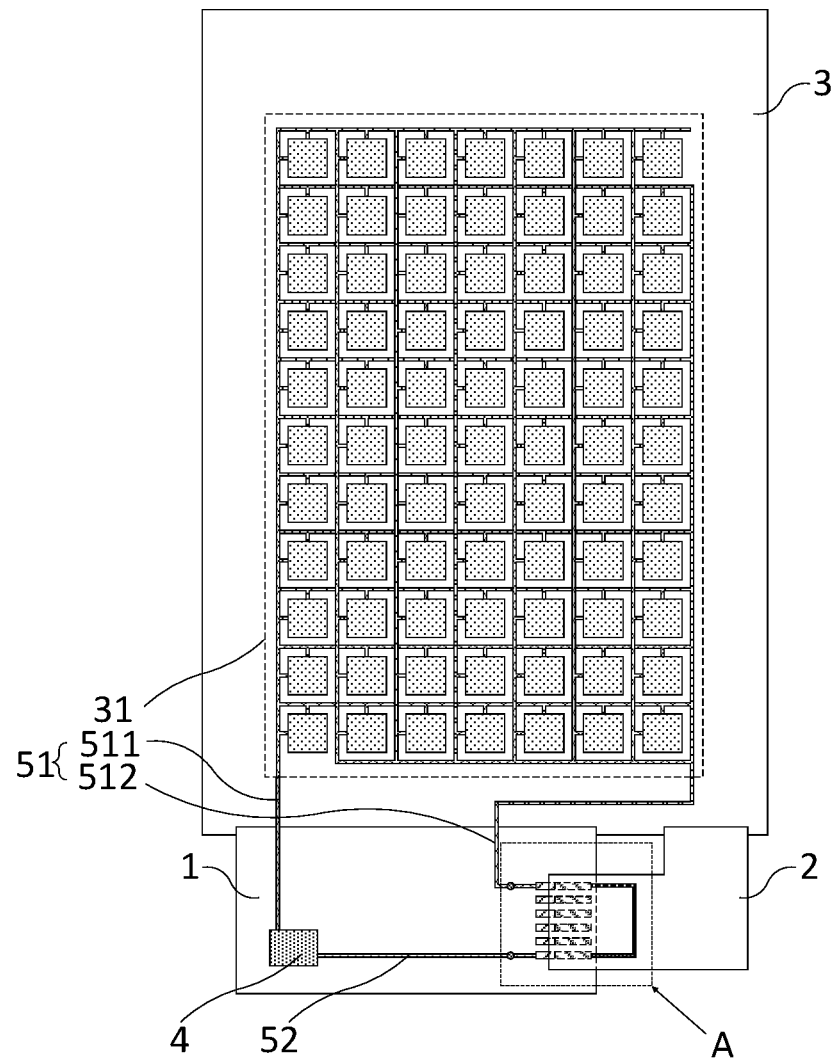
FIG. 3 illustrates a schematic of an exemplary display module according to various embodiments of the present disclosure.
Figure 4:
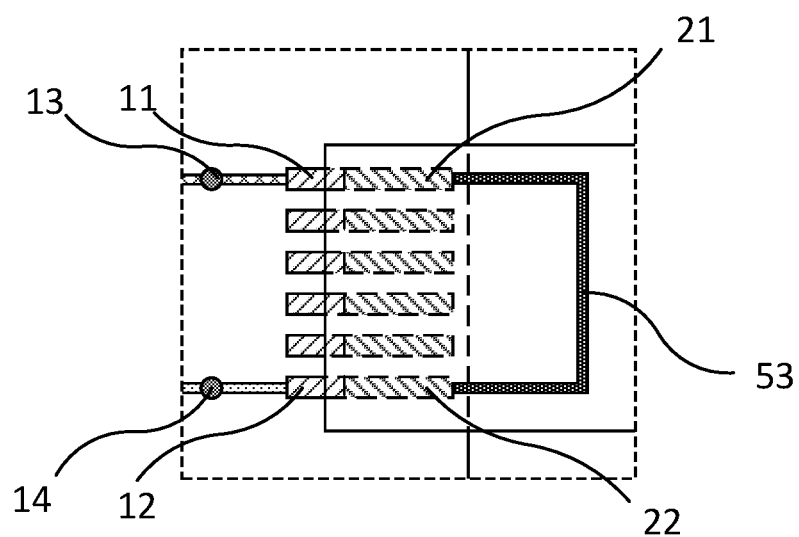
FIG. 4 illustrates an enlarged schematic of a region A in FIG. 3.

FIG. 3 illustrates a schematic of an exemplary display module according to various embodiments of the present disclosure; and FIG. 4 illustrates an enlarged schematic of a region A in FIG. 3. Referring to FIGS. 3-4, the display module may be provided in one embodiment of the present application. The display module may include the display panel 3, the main flexible circuit board 1 and an auxiliary flexible circuit board 2. The display panel 3 may include a light-exiting surface and a back surface opposite to the light-exiting surface. The light-exiting surface may be configured for displaying images, and the display panel 3 may be bound to be connected to the main flexible circuit board 1. The main flexible circuit board 1 may be configured to control the display panel 3; and the contents displayed on the display panel 3 may be controlled by the main flexible circuit board 1. The auxiliary flexible circuit board 2 may be bound to be connected to the main flexible circuit board 1, for assisting the function of the main flexible circuit board 1, such as a touch-control flexible circuit board. The auxiliary flexible circuit board 2 may be bound to be connected to the display panel 3 according to actual needs.

Referring to FIGS. 3-4, the main flexible circuit board 1 may include a first binding terminal 11 and a second binding terminal 12. The auxiliary flexible circuit board 2 may include a third binding terminal 21 and a fourth binding terminal 22; and the third binding terminal 21 and the fourth binding terminal 22 may be electrically connected with each other. The first binding terminal 11 may be disposed corresponding to the third binding terminal 21, and the second binding terminal 12 may be disposed corresponding to the fourth binding terminal 22. When the main flexible circuit board 1 and the auxiliary flexible circuit board 2 are bound to be connected with each other, the first binding terminal 11 may be electrically connected to the third binding terminal 21, and the second binding terminal 12 may be electrically connected to the fourth binding terminal 22. At this point, since the third binding terminal 21 is electrically connected to the fourth binding terminal 22, the first binding terminal 11 and the second binding terminal 12 may be electrically connected to form a loop. Therefore, the line between the main flexible circuit board 1 and the auxiliary flexible circuit board 2 may be in conduction. The main flexible circuit board 1 may further include a first test point 13 and a second test point 14; the first test point 13 may be electrically connected to the first binding terminal 11; and the second test point 14 may be electrically connected to the second binding terminal 12. When the main flexible circuit board 1 and the auxiliary flexible circuit board 2 are not bound to be connected with each other, since the first binding terminal 11 and the second binding terminal 12 are in a disconnected state, the first test point 13 and the second test point 14 may be in a disconnected state. The power consumption test of the display panel 3 may be performed between the first test point 13 and the second test point 14. The main flexible circuit board 1 and the auxiliary flexible circuit board 2 are not bound to be connected with each other, such that the line between the first test point 13 and the second test point 14 may be in a disconnected state; after the main flexible circuit board 1 and the auxiliary flexible circuit board 2 are bound to be connected with each other, the line between the first test point 13 and the second test point 14 may be in a conduction state, such that the normal use of the main flexible circuit board 1 and the auxiliary flexible circuit board 2 may not be affected. Therefore, during the power consumption test in various embodiments of the present application, there is no need to cut a certain portion of the signal line on the main flexible circuit board 1 or the auxiliary flexible circuit board 2, other structures including signal lines on the main flexible circuit board 1 or the auxiliary flexible circuit board 2 may be prevented from being scratched or damaged when the signal line is cut off, thereby implementing the non-destructive detection of the display module.

Figure 5:
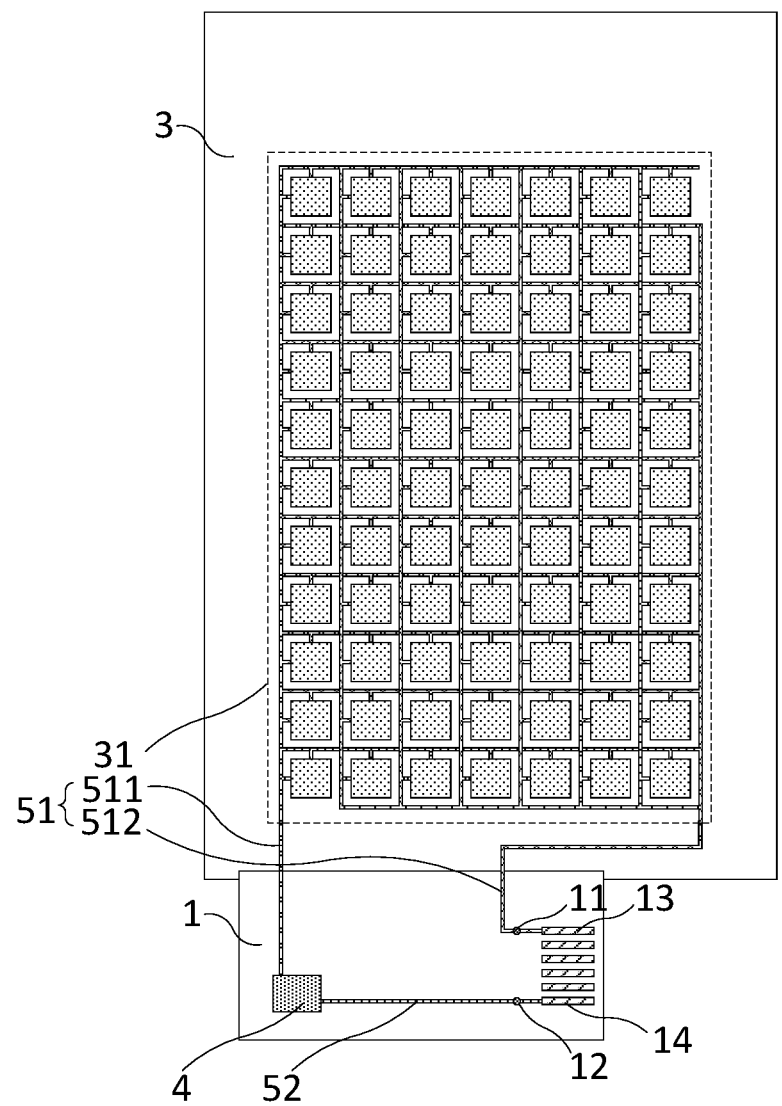
FIG. 5 illustrates a schematic of an exemplary display module in a first state according to various embodiments of the present disclosure.

FIG. 5 illustrates a schematic of an exemplary display module in a first state according to various embodiments of the present disclosure. The display module may include the first state and a second state. In the first state and in the second state, the first test point 13 and the second test point 14 may be configured to perform different tests on the display module, respectively.

Referring to FIG. 5, in the first state, the main flexible circuit board 1 may be separated from the auxiliary flexible circuit board 2; and the first test point 13 and the second test point 14 may be configured for a first test. The first test may be taken as an example of the power consumption test. Since the main flexible circuit board 1 is separated from the auxiliary flexible circuit board 2, the first test point 13 and the second test point 14 may be in a disconnected state. At this point, the power consumption test circuit may be connected between the first test point 13 and the second test point 14 to measure the power consumption of the display panel 3 and the main flexible circuit board 1. Since the power consumption of the display panel 3 is significantly greater than the power consumption of the main flexible circuit board 1, the measurement result may be approximated to be the power consumption of the display panel 3.

Figure 6:
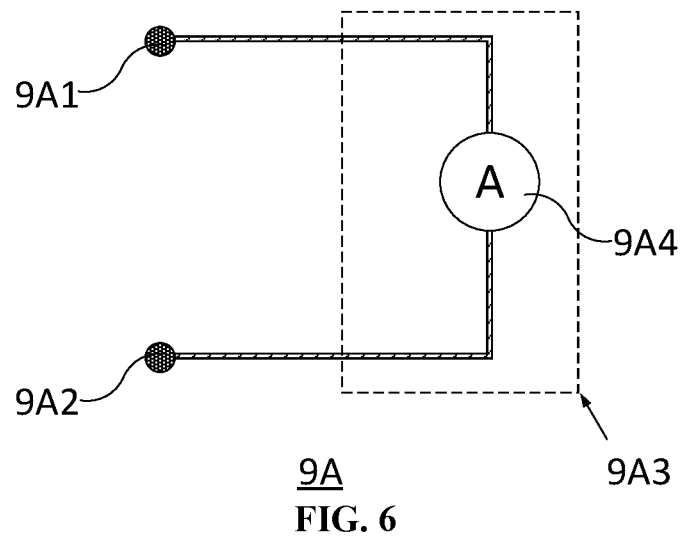
FIG. 6 illustrates a schematic of an exemplary first test circuit according to various embodiments of the present disclosure.
Figure 7:
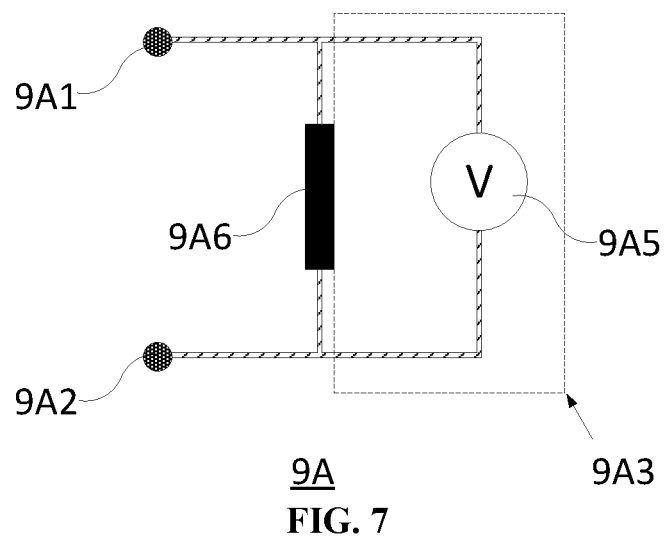
FIG. 7 illustrates a schematic of another exemplary first test circuit according to various embodiments of the present disclosure.

FIG. 6 illustrates a schematic of an exemplary first test circuit 9A according to various embodiments of the present disclosure; and FIG. 7 illustrates a schematic of another exemplary first test circuit 9A according to various embodiments of the present disclosure. Referring to FIGS. 6-7, the first test including measuring the power consumption of the display panel may be taken as an example. The first test circuit 9A may include a first connection terminal 9A1, a second connection terminal 9A2, and a first test unit 9A3. The first test unit 9A3 may be configured to obtain test results. One end of the first test unit 9A3 may be electrically connected to the first connection terminal 9A1, and the other end of the first test unit 9A3 may be electrically connected to the second connection terminal 9A2. When using the first test circuit 9A, the first connection terminal 9A1 may be electrically connected to the first test point 13, and the second connection terminal 9A2 may be electrically connected to the second test point 14, thereby performing the first test. The first test circuit 9A is connected between the first test point 13 and the second test point 14, such that the line between the first test point 13 and the second test point 14 may form a complete loop with the first test circuit 9A. The display panel 3 may be in operation normally as long as the external power supply is connected. At this point, the total power consumption of the display panel 3 and the main flexible circuit board 1 may be obtained through the test results of the first test circuit 9A. The power consumption of the display panel 3 is significantly greater than the power consumption of the main flexible circuit board 1, so that the obtained total power consumption of the display panel 3 and the main flexible circuit board 1 may be approximately equal to the power consumption of the display panel 3. After completing the first test, the first connection terminal 9A1 may be separated from the first test point 13, the second connection terminal 9A2 may be separated from the second test point 14, and the first test circuit 9A may be removed.

Referring to FIG. 6, the first test unit 9A3 may include a first current detection device 9A4, one end of the first current detection device 9A4 may be electrically connected to the first connection terminal 9A1, and the other end of the first current detection device 9A4 may be connected to the second connection terminal 9A2. The power consumption W of the display panel may satisfy: $W = I \cdot V_{pvdd}$, where I is the measured current value of the first current detection device 9A4, and $V_{pvdd}$ is the voltage of the external power supply.

Referring to FIG. 7, the first test circuit 9A may include a test resistor 9A6 and a first voltage detection device 9A5; and the test resistor 9A6 may be connected in parallel with the first voltage detection device 9A5 to form the first test unit 9A3. The power consumption W of the display panel may satisfy:

$$W = \frac{U}{R} \cdot V_{pvdd},$$

where U is the measured voltage value of the first voltage detection device 9A5, R is the resistance value of the test resistor 9A6, and $V_{pvdd}$ is the voltage of the external power supply.

Referring to FIGS. 3-4, in the second state, the main flexible circuit board 1 and the auxiliary flexible circuit board 2 are bound to be connected with each other, the first binding terminal 11 may be electrically connected to the third binding terminal 21, and the second binding terminal 12 may be electrically connected to the fourth binding terminal 22; and the first test point 13 and the second test point 14 may be configured for the second test. The second test may be different from the first test; and the second test may take an impedance test as an example. The main flexible circuit board 1 and the auxiliary flexible circuit board 2 are bound to be connected with each other, such that the first test point 13 and the second test point 14 may be in a conduction state. Compared with the line between the display panel 3 and the main flexible circuit board 1, the first test point 13 and the second test point 14 may be regarded as being in a short-circuit state. At this point, an impedance test circuit may be connected between the first test point 13 and the second test point 14 to measure the impedance at the binding connection position between the main flexible circuit board 1 and the auxiliary flexible circuit board 2.

Figure 8:
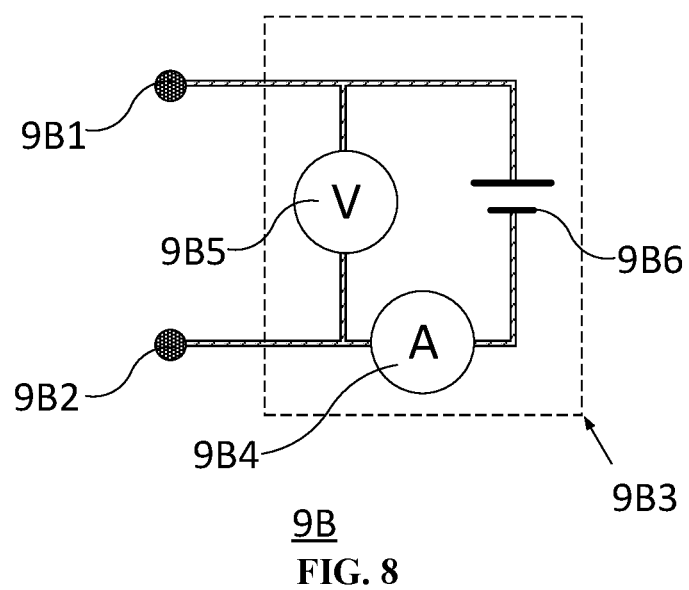
FIG. 8 illustrates a schematic of an exemplary second test circuit according to various embodiments of the present disclosure.

FIG. 8 illustrates a schematic of an exemplary second test circuit according to various embodiments of the present disclosure. Referring to FIG. 8, the second test including measuring the impedance of the binding connection between the main flexible circuit board and the auxiliary flexible circuit board may be taken as an example. The second test circuit 9B may include a third connection terminal 9B1, a fourth connection terminal 9B2, and a second test unit 9B3. The second test unit 9B3 may be configured to obtain test results; one end of the second test unit 9B3 may be electrically connected to the third connection terminal 9B1, and the other end of the second test unit 9B3 may be electrically connected to the fourth connection terminal 9B2. The third connection terminal 9B1 may be electrically connected to the first test point 13, and the fourth connection terminal 9B2 may be electrically connected to the second test point 14, thereby performing the second test. The second test unit 9B3 may include a test power supply 9B6, a second voltage detection device 9B5, and a second current detection device 9B4. The test power supply 9B6 may be connected in series with the second current detection device 9B4. The second voltage detection device 9B5 may be connected in parallel with the test power supply 9B6 and the second current detection device 9B4 which are connected in series with each other. The third connection terminal 9B1 may be electrically connected to the first test point 13, and the fourth connection terminal 9B2 may be electrically connected to the second test point 14; when the display module is not connected to an external power source, the display panel 3 may not in operation. When the second test circuit 9B is connected, the test power supply 9B6 may provide power. The first test point 13, the first binding terminal 11, the third binding terminal 21, the fourth binding terminal 22, the second binding terminal 12, and the second test point 14 may be electrically connected in sequence to be in a short-circuit state; at this point, the resistance value obtained by the second test circuit 9B may be the resistance value between the first test point 13, the first binding terminal 11, the third binding terminal 21, the fourth binding terminal 22, the second binding terminal 12, and the second test point 14. The resistance at the electrical connection position between the first binding terminal 11 and the third binding terminal 21 and the resistance at the electrical connection position between the second binding terminal 12 and the fourth binding terminal 22 are significantly larger than the resistances at other positions. Therefore, the resistance value obtained by the second test circuit 9B may be approximately equal to the impedance of the binding connection between the main flexible circuit board 1 and the auxiliary flexible circuit board 2. The impedance of the binding connection between the main flexible circuit board 1 and the auxiliary flexible circuit board 2 may satisfy:

$$R_{FOF} = \frac{U}{I},$$

where U is the voltage value measured by the second voltage detection device 9B5, and I is the current value measured by the second current detection device 9B4. It should be noted that both the main flexible circuit board 1 and the auxiliary flexible circuit board 2 may include at least two binding terminals; when the main flexible circuit board 1 and the auxiliary flexible circuit board 2 are bound to be connected with each other, under the premise that the first binding terminal 11 and the third binding terminal 21 are electrically connected and the second binding terminal 12 and the fourth binding terminal 22 are electrically connected, any two of all binding terminals of the main flexible circuit board 1 may be used as the first binding terminal 11 and the second binding terminal 12, respectively. The main flexible circuit board 1 and the auxiliary flexible circuit board 2 may be bound to be connected in a form where one of the main flexible circuit board 1 and the auxiliary flexible circuit board 2 covers the other one of main flexible circuit board 1 and the auxiliary flexible circuit board 2. After the main flexible circuit board 1 and the auxiliary flexible circuit board 2 are bound to be connected with each other, the binding terminals of the main flexible circuit board 1 may be covered by the corresponding binding terminals on the auxiliary flexible circuit board 2. Therefore, on the auxiliary flexible circuit board 2, the binding terminal corresponding to the first binding terminal 11 may be the third binding terminal 21, and the binding terminal corresponding to the second binding terminal 12 may be the fourth binding terminal 22.

Referring to FIGS. 3-4, the first test point 13 may be disposed spaced apart from the first binding terminal 11, and the second test point 14 may be disposed spaced apart from the second binding terminal 12. Two terminals for connecting the test circuit may be disposed on the main flexible circuit board 1, and the two terminals may be used as the first test point 13 and the second test point 14, respectively.

Therefore, in the first state, the first test point 13 and the second test point 14 may be configured for the first test; in the second state, the first test point 13 and the second test point 14 may be configured for the second test; and the binding connection between the main flexible circuit board 1 and the auxiliary flexible circuit board 2 may not affect the second test.

Figure 9:
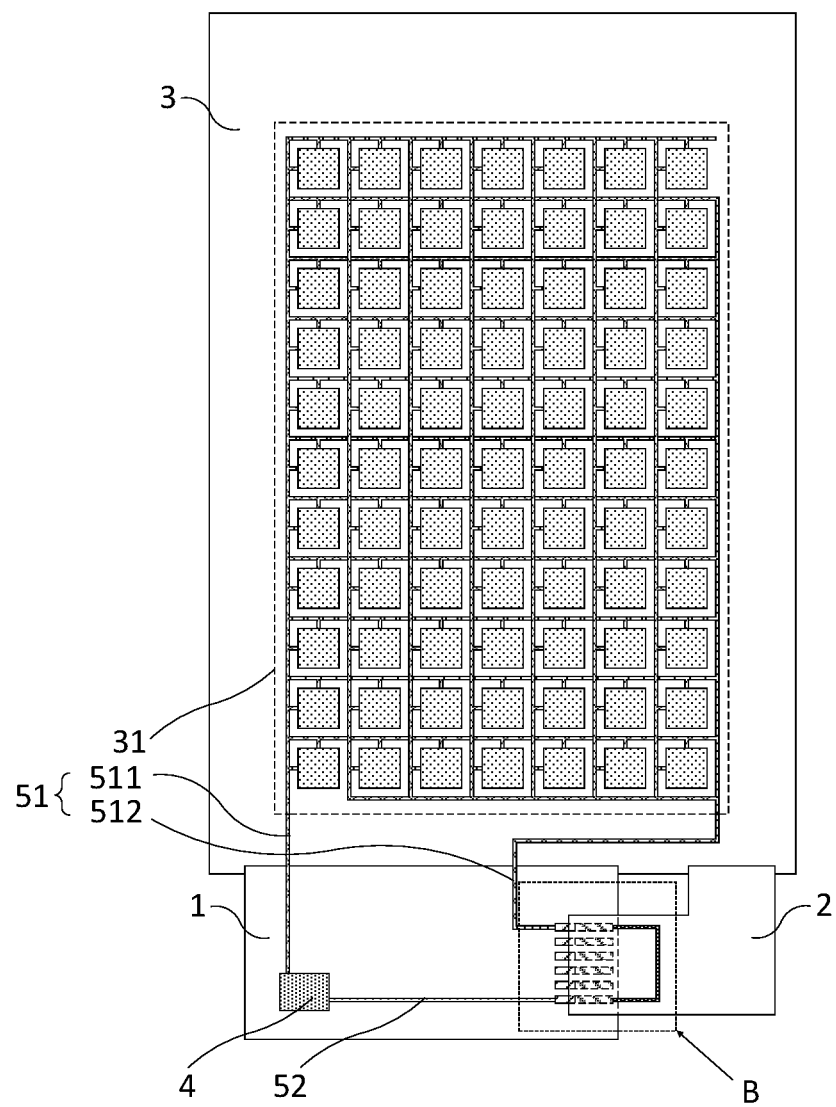
FIG. 9 illustrates a schematic of another exemplary display module according to various embodiments of the present disclosure.
Figure 10:
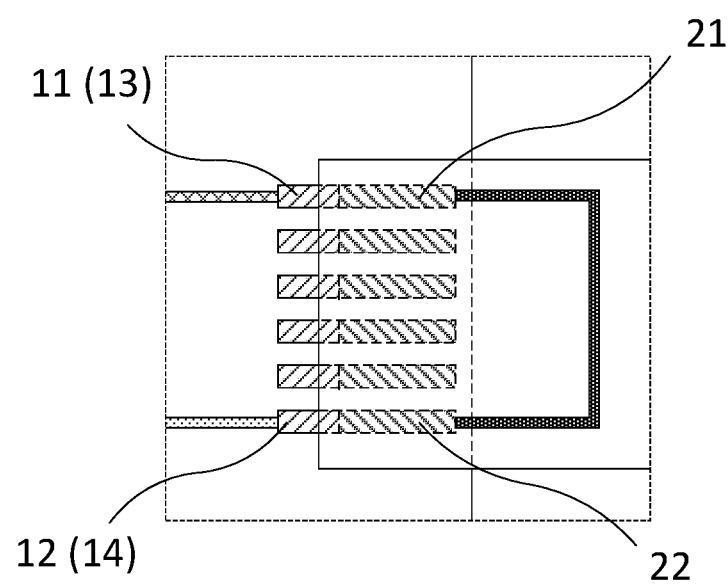
FIG. 10 illustrates an enlarged schematic of a region B in FIG. 9.

FIG. 9 illustrates a schematic of another exemplary display module according to various embodiments of the present disclosure; and FIG. 10 illustrates an enlarged schematic of a region B in FIG. 9. Referring to FIGS. 9-10, the first binding terminal 11 may be multiplexed as the first test point 13, and the second binding terminal 12 may be multiplexed as the second test point 14. Therefore, on the main flexible circuit board 1, the terminals, which are connected to the test circuit, may not need to be disposed for the first test point 13 and the second test point 14 at various embodiments of the present application, which saves the space of the main flexible circuit board 1; when performing the first test, the test circuit may be directly connected between the first binding terminal 11 and the second binding terminal 12 to perform the first test. During the first test, the entire first binding terminal 11 may be multiplexed as the first test point 13, and the first connection terminal of the first test circuit may be electrically connected to the entire first binding terminal 11, such that a relatively large contact area may be between the first connection terminal and the first binding terminal 11. The relatively large contact area may prevent the contact resistance of the electrical connection between the first connection terminal and the first binding terminal 11 from being excessively large, thereby preventing the power consumption of the contact resistance from affecting the accuracy of the power consumption test. Similarly, the entire second binding terminal 12 may also be electrically connected to the second contact terminal, thereby preventing the power consumption of the contact resistance from affecting the accuracy of the power consumption test.

Figure 11:
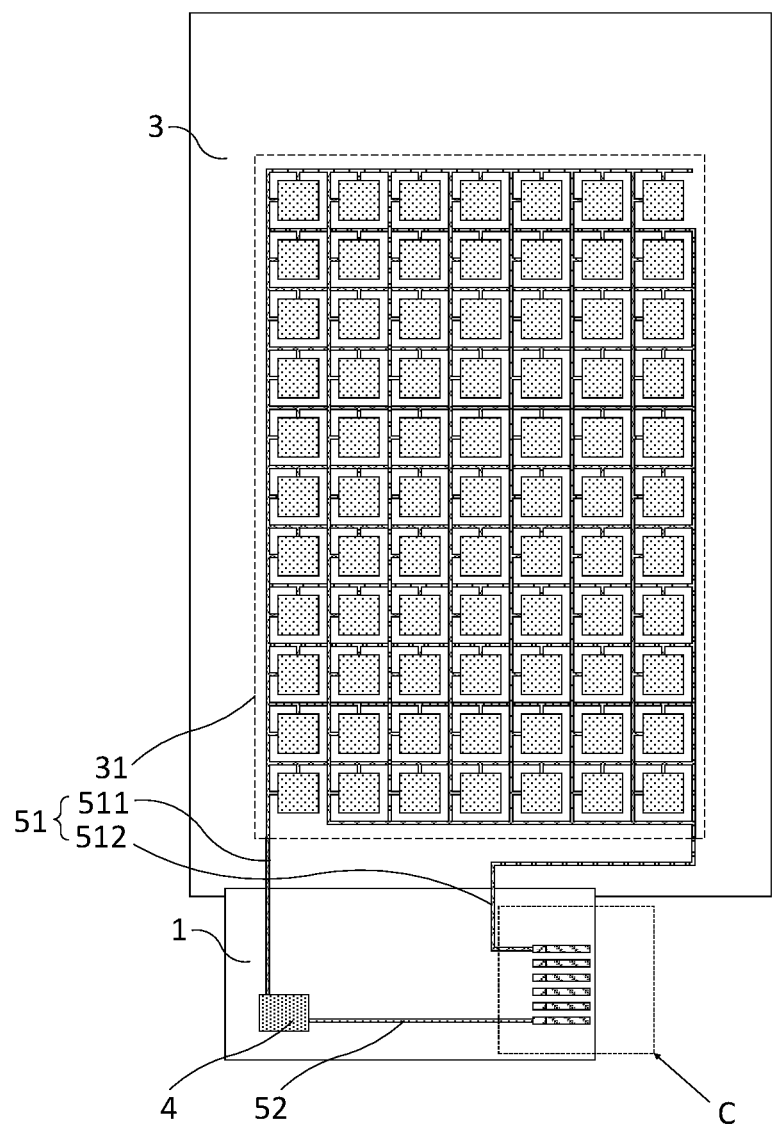
FIG. 11 illustrates a schematic of another exemplary display module in a first state according to various embodiments of the present disclosure.
Figure 12:
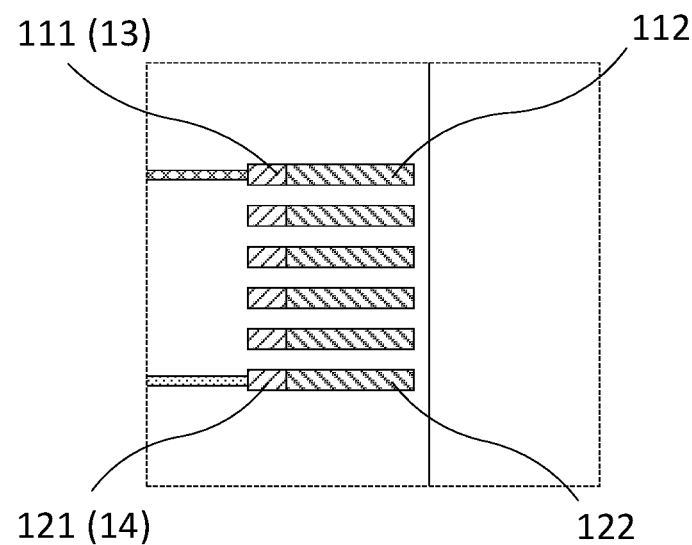
FIG. 12 illustrates an enlarged schematic of a region C in FIG. 11.

FIG. 11 illustrates a schematic of another exemplary display module in the first state according to various embodiments of the present disclosure; and FIG. 12 illustrates an enlarged schematic of a region C in FIG. 11. Referring to FIGS. 11-12, the first binding terminal 11 may include a first electrical connection portion 112 and a first exposed portion 111; in the second state, the first exposed portion 111 may be multiplexed as the first test point 13, and the first electrical connection portion 112 may be electrically connected to the third binding terminal 21; the second binding terminal 12 may include a second electrical connection portion 122 and a second exposed portion 121; and in the second state, the second exposed portion 121 may be multiplexed as the second test point 14, and the second electrical connection portion 122 may be electrically connected to the fourth binding terminal 22. In the second state, the third binding terminal 21 may be electrically connected to a portion of the first binding terminal 11 by covering the first binding terminal 11, and the fourth binding terminal 22 may be electrically connected to a portion of the second binding terminal 12 by covering the second binding terminal 12, which may meet the binding connection requirement between the main flexible circuit board 1 and the auxiliary flexible circuit board 2. In the second state, the first exposed portion 111 may be a portion of the first binding terminal 11, which may not be covered by the third binding terminal 21. The first exposed portion 111 is not covered by the third binding terminal 21, such that the first exposed portion 111 may be multiplexed as the first test point 13, and the binding connection between the main flexible circuit board 1 and the auxiliary flexible circuit board 2 may not affect the use of the first test point 13 in the second test; and there is no need to separately provide a terminal on the main flexible circuit board 1 as the first test point 13, which may save the available space of the main flexible circuit board 1. Similarly, in the second state, the second exposed portion 121 may be a portion of the second binding terminal 12, which may not be covered by the fourth binding terminal 22. The second exposed portion 121 is not covered by the fourth binding terminal 22, such that the second exposed portion 121 may be multiplexed as the second test point 14, and the binding connection between the main flexible circuit board 1 and the auxiliary flexible circuit board 2 may not affect the use of the second test point 14 in the second test; and there is no need to separately provide a terminal on the main flexible circuit board 1 as the second test point 14, which may further save the available space of the main flexible circuit board 1.

Figure 13:
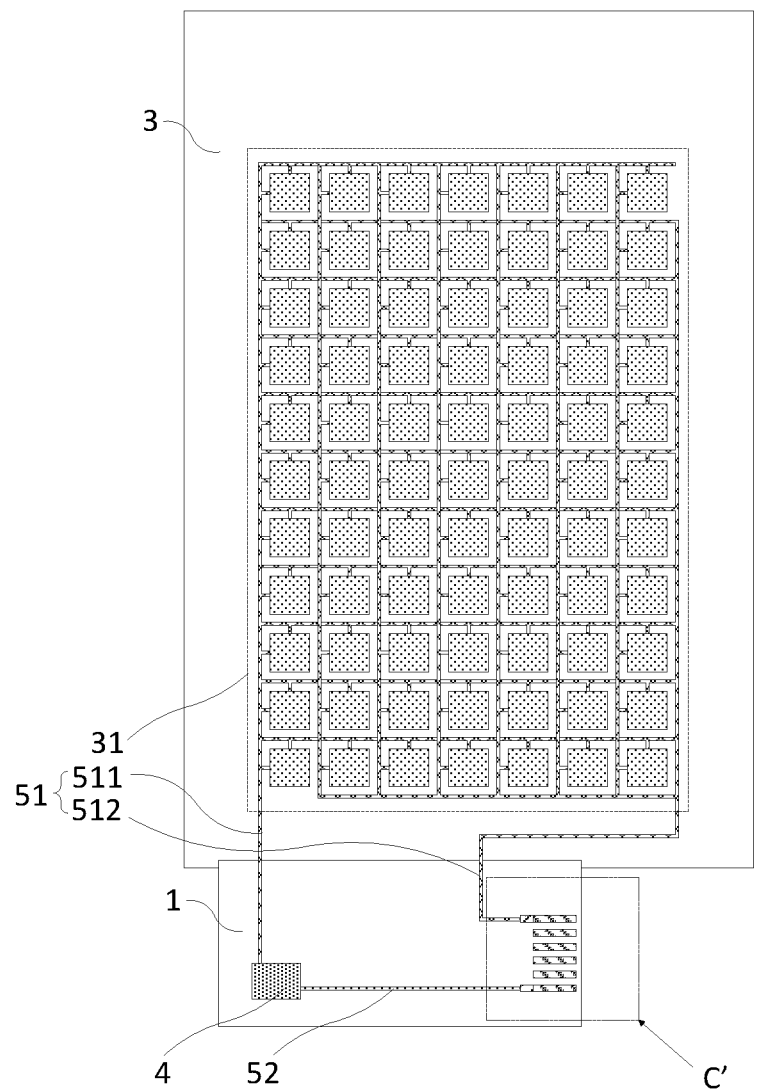
FIG. 13 illustrates a schematic of another exemplary display module in a first state according to various embodiments of the present disclosure.
Figure 14:
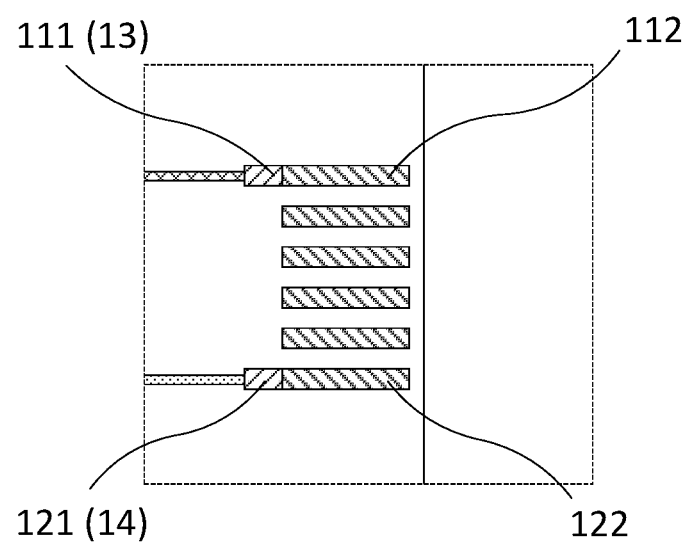
FIG. 14 illustrates an enlarged schematic of a region C' in FIG. 13.

FIG. 13 illustrates a schematic of another exemplary display module in the first state according to various embodiments of the present disclosure; and FIG. 14 illustrates an enlarged schematic of a region C' in FIG. 13. Referring to FIGS. 13-14, the first binding terminal 11 may include the first electrical connection portion 112 and the first exposed portion 111, which is equivalent to that the area of the first binding terminal 11 is larger than that of the third binding terminal 21 and the portion not covered by the third binding terminal 21 may be the first exposed portion 111. Only the first binding terminal 11 needs to be multiplexed as the first test point 13, so that in the main flexible circuit board 1, the area of the first binding terminal 11 may be larger than the areas of other binding terminals except the second binding terminal 12. Similarly, the area of the second binding terminal 12 may be larger than that of the fourth binding terminal 22, and the area of the second binding terminal 12 may also be larger than the areas of other binding terminals except the fourth binding terminal 22.

Referring to FIGS. 3-4, the display module may further include the power management chip 4 and the first wiring 5. The power management chip 4 may be located on the main flexible circuit board 1 to provide power for the display module. The first wiring 5, used as a power supply loop, may include a first signal line 51 and a second signal line 52. The first test point 13 may be electrically connected to the first signal line 51, the first signal line 51 may be electrically connected to the power management chip 4, and at least a portion of the first signal line 51 may be located on the main flexible circuit board 1. The second test point 14 may be electrically connected to the second signal line 52, and the second signal line 52 may be electrically connected to the power management chip 4. In the second state, the first binding terminal 11 may be electrically connected to the third binding terminal 21, the second binding terminal 12 may be electrically connected to the fourth binding terminal 22, and the third binding terminal 21 may be electrically connected to the fourth binding terminal 22. Therefore, in the second state, the first wiring 5 may form a complete loop to ensure the basic functions of the display module; and in the first state, the portion of the first wiring 5 between the first binding terminal 11 and the second binding terminal 12 may be in a disconnected state, which is convenient for the first test. It should be noted that the first signal line 51 may include a first sub-line 511 and a second sub-line 512; the circuit of the display panel 3 may be electrically connected to the power management chip 4 through the first sub-line 511; and the circuit of the display panel 3 may be electrically connected to the first test point 13 through the second sub-line 512. Exemplarily, the circuit of the display panel 3 may include a pixel circuit 31 of the display panel 3, and the pixel circuit 31 may be configured to emit light of the display panel 3. In the second state, a loop may be formed between the power management chip 4, the first sub-line 511, the pixel circuit 31, the second sub-line 512, and the second signal line 52, such that the display panel 3 may function normally.

Referring to FIGS. 3-4, the first wiring 5 may further include a third signal line 53. The third signal line 53 may be electrically connected to each of the third binding terminal 21 and the fourth binding terminal 22. In the second state, the first binding terminal 11 may be electrically connected to the third binding terminal 21, and the second binding terminal 12 may be electrically connected to the fourth binding terminal 22. At this point, the power management chip may be electrically connected to the first signal line 51; the first signal line 51 may be electrically connected to the first test point 13; the first test point 13 may be electrically connected to the first binding terminal 11; the first binding terminal 11 may be electrically connected to the third binding terminal 21; the third binding terminal 21 may be electrically connected to the third signal line 53; the third signal line 53 may be electrically connected to the fourth binding terminal 22; the fourth binding terminal 22 may be electrically connected to the second binding terminal 12; the second binding terminal 12 may be electrically connected to the second test point 14; the second test point 14 may be electrically connected to the second signal line 52; and the second signal line 52 may be electrically connected to the power management chip, thereby forming a complete loop by the power management chip and the first wiring 5. By disposing the third signal line 53, any two binding terminals on the auxiliary flexible circuit board 2 may be used as the third binding terminal 21 and the fourth binding terminal 22, and the electrical connection between the third binding terminal 21 and the fourth binding terminal 22 may be satisfied.

Figure 15:
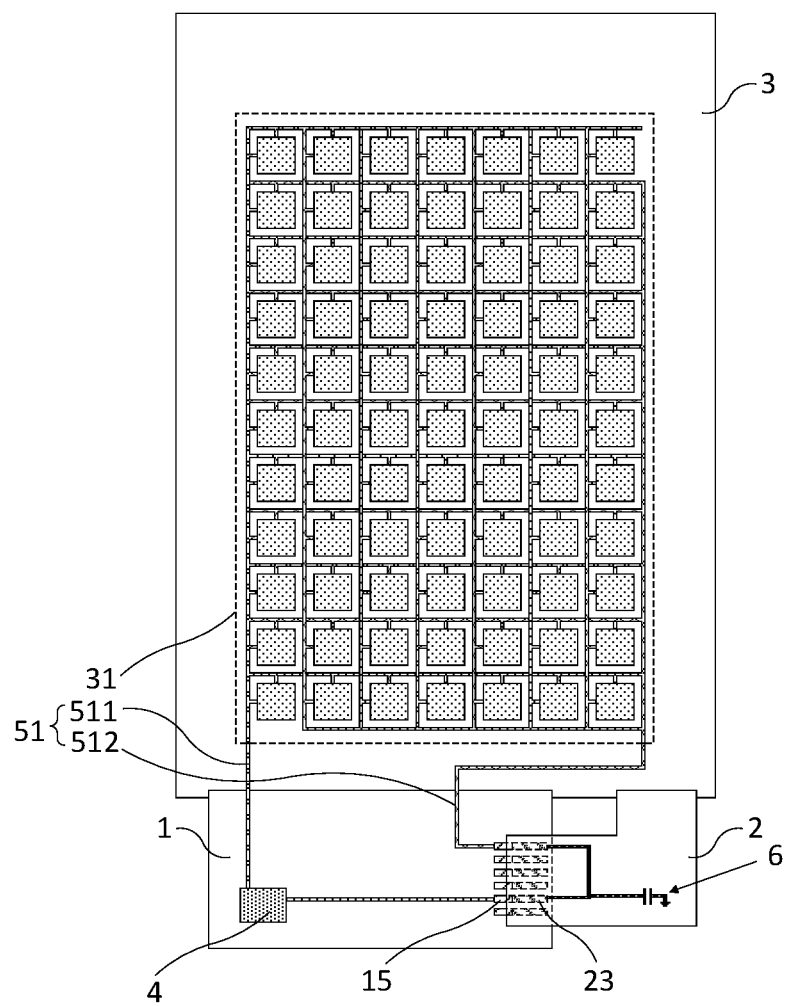
FIG. 15 illustrates a schematic of another exemplary display module according to various embodiments of the present disclosure.

FIG. 15 illustrates a schematic of another exemplary display module according to various embodiments of the present disclosure. Referring to FIG. 15, the display module may further include a first non-touch-control device 6 for the first function of the main flexible circuit board 1. Exemplarily, referring to FIG. 15, when the first non-touch-control device 6 is a capacitor, the first function may be filtering or preventing a charging current from being generated when being powered on; when the first non-touch-control device 6 is a diode, the first function may be anti-static, or preventing backflow current; when the first non-touch-control device 6 is a resistor, the first function may be resistance-capacitance (RC) filtering; and when the first touch device is a photo-sensing chip, the first function may be photosensitive imaging. The main flexible circuit board 1 may further include a fifth binding terminal 15, and the auxiliary flexible circuit board 2 may further include a sixth binding terminal 23, where the fifth binding terminal 15 may be electrically connected to the sixth binding terminal 23, the first non-touch-control device 6 may be electrically connected to the sixth binding terminal 23, and the first non-touch-control device 6 may be located on the auxiliary flexible circuit board 2. The first non-touch-control device 6 may be configured for the first function of the main flexible circuit board 1; therefore, in the existing technology, the first non-touch-control device 6 may be disposed at the main flexible circuit board 1, which may cause the components of the main flexible circuit board 1 to be crowded, thereby reducing the available space. For various embodiment of the present application, in the second state, the fifth binding terminal 15 may be electrically connected to the sixth binding terminal 23, such that the first non-touch-control device 6 may be disposed on the auxiliary flexible circuit board 2 without occupying the main flexible circuit board 1, which may save the space of the main flexible circuit board 1 and be beneficial for the wiring design of the main flexible circuit board 1.

Figure 16:
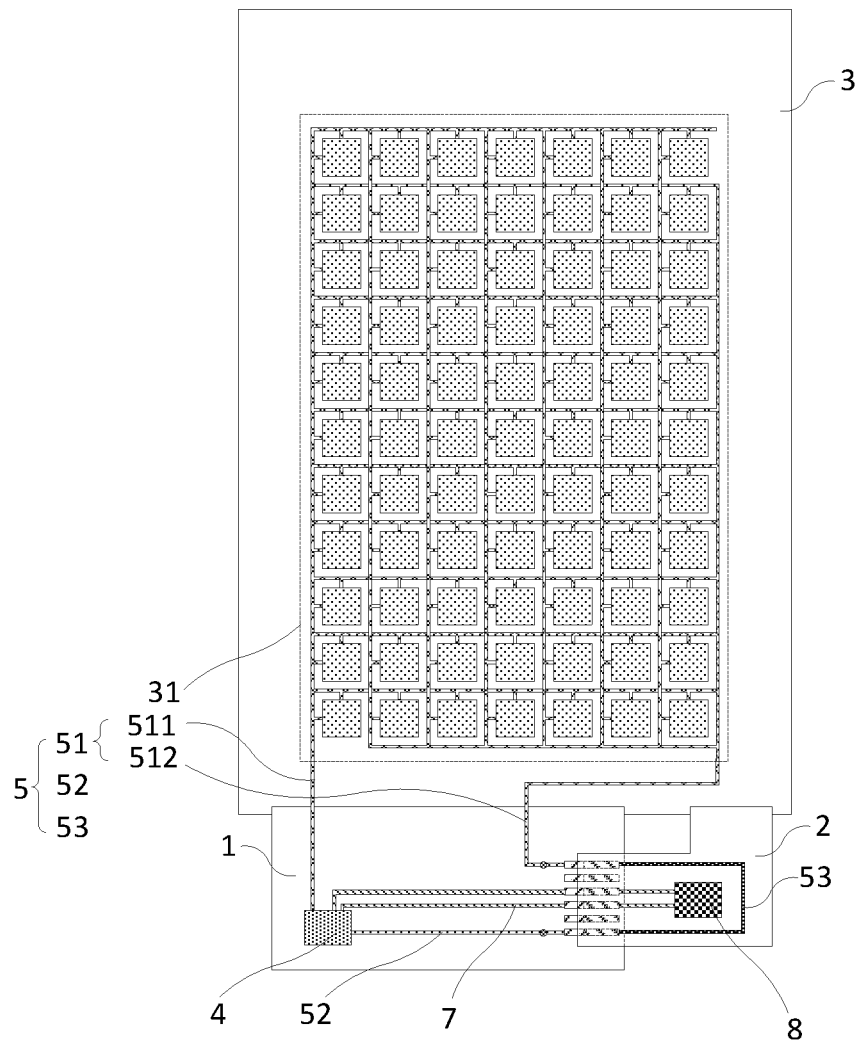
FIG. 16 illustrates a schematic of another exemplary display module according to various embodiments of the present disclosure.

FIG. 16 illustrates a schematic of another exemplary display module according to various embodiments of the present disclosure. The first wiring 5 may include the first signal line 51, the second signal line 52 and the third signal line 53. Referring to FIG. 16, in the second state, the display module may further include at least one fourth signal line 7 and a first chip 8. The first chip 8, located on the auxiliary flexible circuit board 2, may be configured for the second function of the auxiliary flexible circuit board 2. Exemplarily, when the display panel 3 has a touch-control function, the second function may be touch control. The first chip 8 and the power management chip may be electrically connected through the fourth signal line 7, and the power management chip may supply power to the first chip 8 through the fourth signal line 7. In the second state, the projections of the fourth signal line 7 and the first chip 8 on the plane where the main flexible circuit board 1 is located may be in the region enclosed by the projections of the first wiring 5 and the power management chip 4 on the plane where the main flexible circuit board 1 is located. In the first wiring 5, the line formed by the first test point 13, the first binding terminal 11, the third binding terminal 21, the third signal line 53, the fourth binding terminal 22, the second binding terminal 12, and the second test point 14 may bypass the first chip 8 and the fourth signal line 7. Therefore, there will be no crossover with the fourth signal line 7, thereby avoiding signal crosstalk caused by signal line crossing. The projections of the fourth signal line 7 and the first chip 8 on the plane where the main flexible circuit board 1 is located may be in the region enclosed by the projections of the first wiring 5 and the power management chip 4 on the plane where the main flexible circuit board 1 is located. Therefore, on the main flexible circuit board 1, the fifth binding terminal 15 may be located between the first binding terminal 11 and the second binding terminal 12; and correspondingly, the sixth binding terminal 23 may be located between the third binding terminal 21 and the fourth binding terminal 22.

Figure 17:
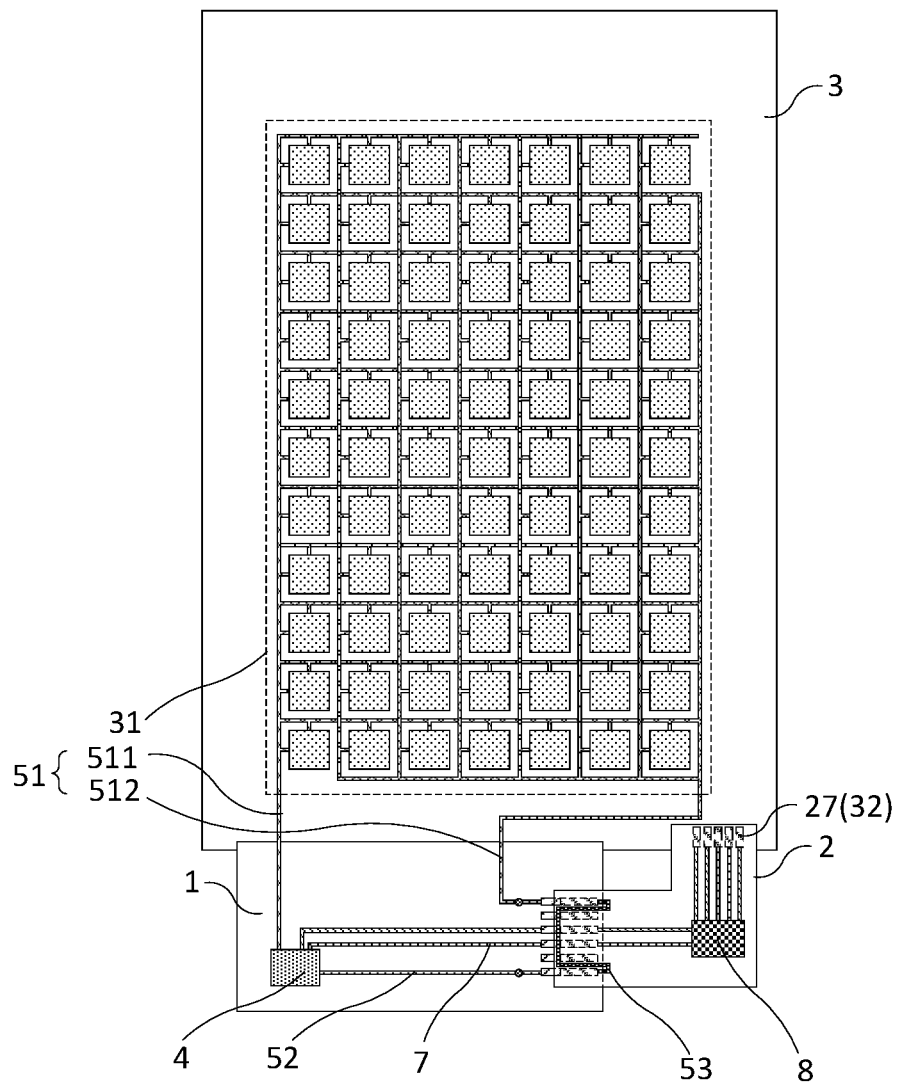
FIG. 17 illustrates a schematic of another exemplary display module according to various embodiments of the present disclosure.
Figure 18:
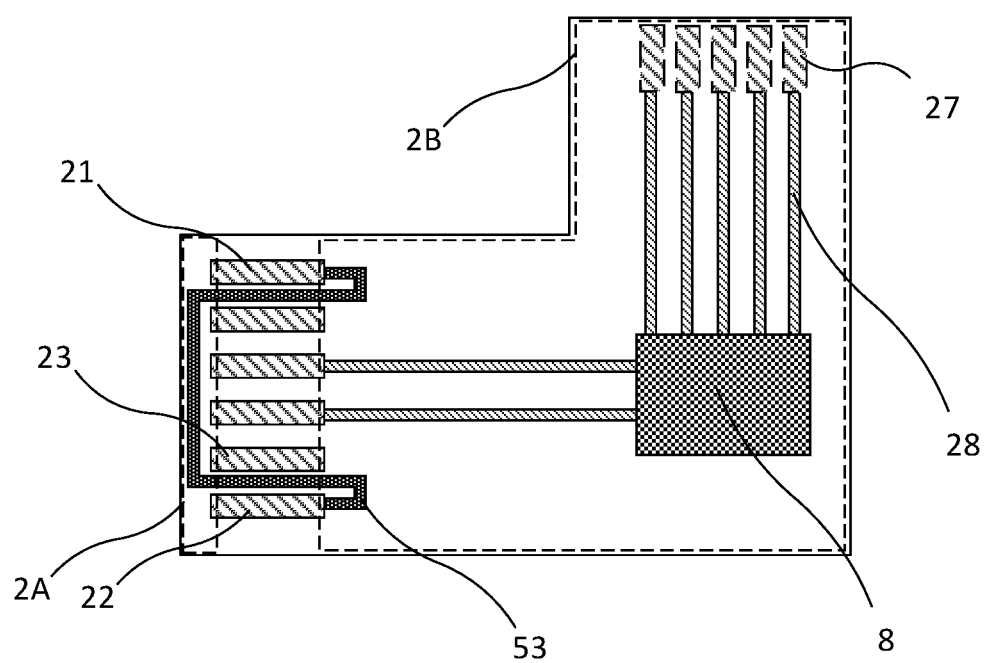
FIG. 18 illustrates a schematic of an auxiliary flexible circuit board in FIG. 17.

FIG. 17 illustrates a schematic of another exemplary display module according to various embodiments of the present disclosure; and FIG. 18 illustrates a schematic of the auxiliary flexible circuit board in FIG. 17. Referring to FIGS. 17-18, the auxiliary flexible circuit board 2 may further include a seventh binding terminal 27, and the display panel 3 may further include an eighth binding terminal 32; and the seventh binding terminal 27 and the eighth binding terminal 32 may be bound to be connected with each other, such that the auxiliary flexible circuit board 2 and the display panel 3 may be bound to be connected with each other. The auxiliary flexible circuit board 2 may further include a seventh signal line 28, one end of the seventh signal line 28 may be electrically connected to the first chip 8, and the other end of the seventh signal line 28 may be electrically connected to the seventh binding terminal 27. When the auxiliary flexible circuit board 2 is a touch-control flexible circuit board, the display module of various embodiments of the present application may further include a touch-control panel, and the eighth binding terminal 32 may be electrically connected to the touch-control panel, thereby implementing the control of the touch-control panel by the auxiliary flexible circuit board 2.

Referring to FIG. 18, the third binding terminal 21, the fourth binding terminal 22 and the sixth binding terminal 23 may be disposed to be arranged along a first direction. The auxiliary flexible circuit board 2 may also include a first wiring region 2A and a second wiring region 2B. Along the direction perpendicular to the first direction, the first wiring region 2A and the second wiring region 2B may be respectively located on two sides of the third binding terminal 21. The first chip 8 and at least a portion of the seventh signal line 28 may be located in the first wiring region 2A, and at least a portion of the third signal line 53 may be located in the second wiring region 2B, that is, the third signal line 53 may be wound in the second wiring region 2B. In such way, the third signal line 53 and the seventh signal line 28 may not cross with each other on the auxiliary flexible circuit board 2, thereby avoiding signal crosstalk caused by line crossing.

Figure 19:
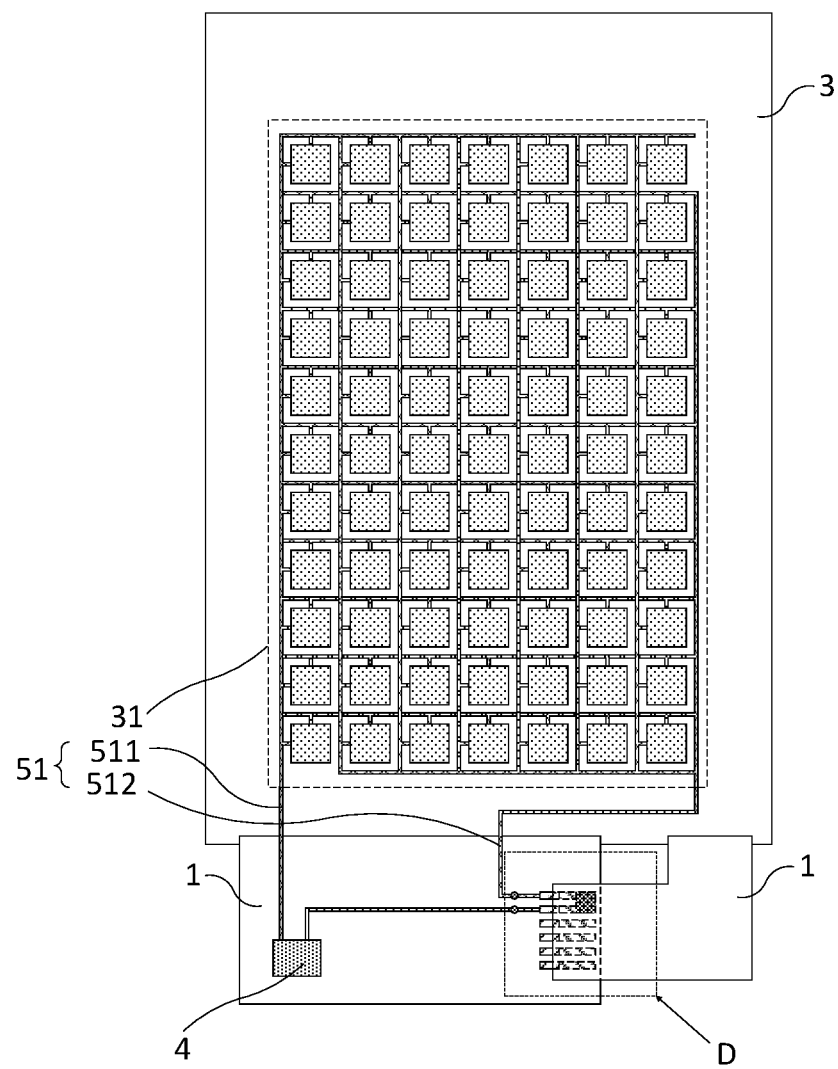
FIG. 19 illustrates a schematic of another exemplary display module according to various embodiments of the present disclosure.
Figure 20:
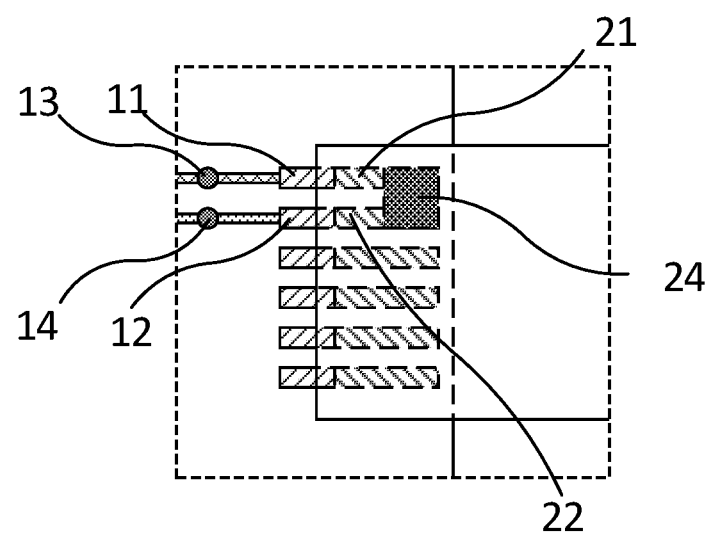
FIG. 20 illustrates an enlarged schematic of a region D in FIG. 19.

FIG. 19 illustrates a schematic of another exemplary display module according to various embodiments of the present disclosure; and FIG. 20 illustrates an enlarged schematic of a region D in FIG. 19. Referring to FIGS. 19-20, the auxiliary flexible circuit board 2 may further include an electrical connection terminal 24. The electrical connection terminal 24 may be electrically connected to each of the third binding terminal 21 and the fourth binding terminal 22. That is, the third binding terminal 21 and the fourth binding terminal 22 may be electrically connected with each other through the electrical connection terminal 24. It should be noted that a direct electrical connection or an indirect electrical connection may be between the electrical connection terminal 24 and the third binding terminal 21 and between the electrical connection terminal 24 and the fourth binding terminal 22.

Exemplarily, referring to FIG. 20, when the direct electrical connection is between the electrical connection terminal 24 and the third binding terminal 21, and between the electrical connection terminal 24 and the fourth binding terminal 22, the orthographic projection of the third binding terminal 21 on the auxiliary flexible circuit board 2 may overlap the orthographic projection of the electrical connection terminal 24 on the auxiliary flexible circuit board 2; the orthographic projection of the fourth binding terminal 22 on the auxiliary flexible circuit board 2 may overlap the orthographic projection of the electrical connection terminal 24 on the auxiliary flexible circuit board 2; and the electrical connection terminal 24 may cover both at least a portion of the third binding terminal 21 and at least a portion of the fourth binding terminal 22. Optionally, in all binding terminals of the auxiliary flexible circuit board 2, two adjacent binding terminals may be selected as the third binding terminal 21 and the fourth binding terminal 22, respectively, which may prevent the electrical connection terminal 24 from covering other binding terminals on the auxiliary flexible circuit board 2, and prevent a short circuit between the electrical connection terminal and the binding terminal caused by covering other binding terminals. Since the electrical connection terminal (e.g., structure) is electrically connected with each of the third binding terminal 21 and the fourth binding terminal 22 directly, other related signal lines may not need to be arranged, thereby saving the space on the auxiliary flexible circuit board 2.

Figure 21:
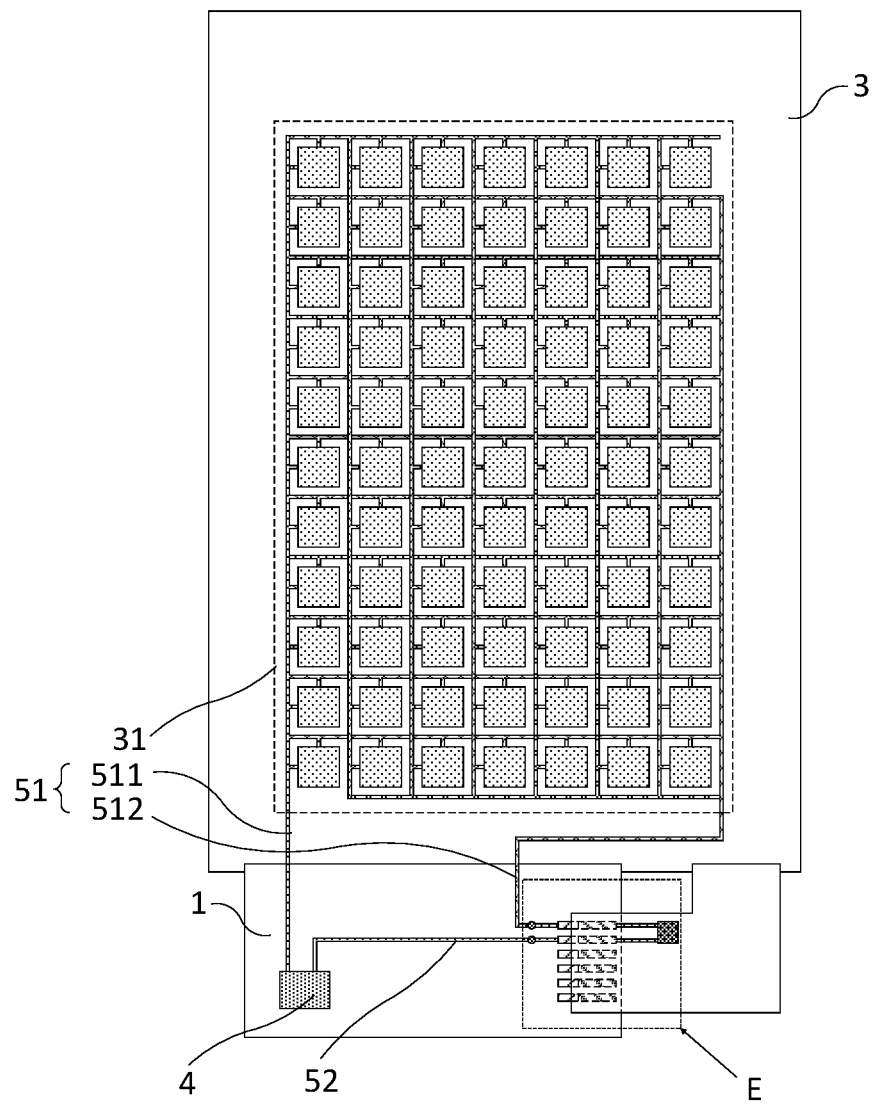
FIG. 21 illustrates a schematic of another exemplary display module according to various embodiments of the present disclosure.
Figure 22:
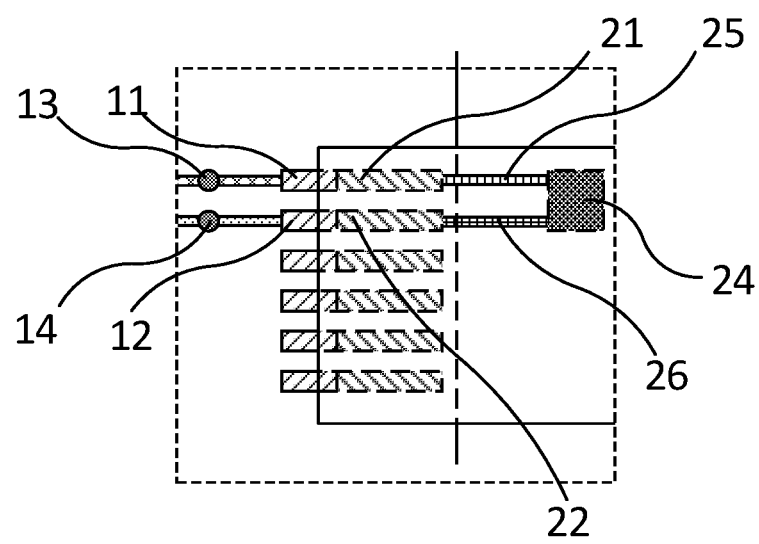
FIG. 22 illustrates an enlarged schematic of a region E in FIG. 21.

FIG. 21 illustrates a schematic of another exemplary display module according to various embodiments of the present disclosure; and FIG. 22 illustrates an enlarged schematic of a region E in FIG. 21. Referring to FIGS. 21-22, when the indirect electrical connection is between the electrical connection terminal 24 and the third binding terminal 21, and between the electrical connection terminal 24 and the fourth binding terminal 22, the electrical connection terminal 24 may be disposed on the flexible circuit board; the third binding terminal 21 may be electrically connected to the electrical connection terminal 24 through a fifth signal line 25 indirectly; and the fourth binding terminal 22 may be electrically connected to the electrical connection terminal 24 through a sixth signal line 26 indirectly. The electrical connection terminal 24 may be configured for electrical connection of other lines on the auxiliary flexible circuit board 2. For example, when the third signal line 53 is multiplexed as the fifth signal line 25 and the sixth signal line 26, the electrical connection terminal 24 may be disposed on the third signal line 53 which is configured for the connection of the first non-touch-control device 6.

Figure 23:
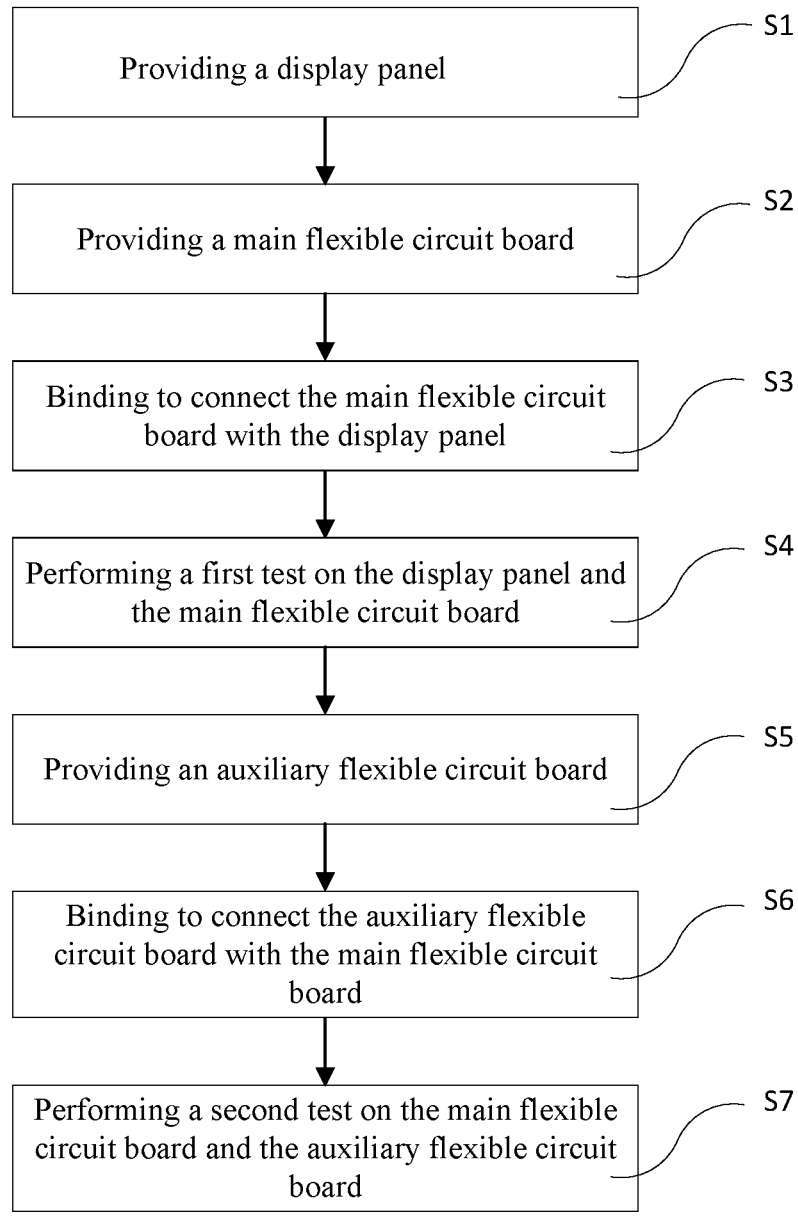
FIG. 23 illustrates a flow chart of a formation method of a display module according to various embodiments of the present disclosure.

FIG. 23 illustrates a flow chart of a formation method of a display module according to various embodiments of the present disclosure. Referring to FIG. 23, various embodiments of the present application also provide the formation method for forming the display module in the above-mentioned embodiments of the present application. The formation method may include the following steps.

In S1, referring to FIG. 23, a display panel may be provided, where the display panel may be an existing display panel.

In S2, referring to FIG. 23, a main flexible circuit board may be provided.

It may need to ensure that the main flexible circuit board may have a first binding terminal, a second binding terminal, a first test point and a second test point; the first test point may be electrically connected to the first binding terminal; and the second test point may be electrically connected to the second binding terminal.

In S3, referring to FIG. 23, the main flexible circuit board and the display panel may be bound to be connected with each other.

At this point, a line may be between the first test point and the second test point configured for signal transmission between the display panel and the main flexible circuit board. A portion of the line may be located on the display panel, and the other portion of the line may be located on the main flexible circuit board. Since the first binding terminal is separated from the second binding terminal at this point, the line may not form a complete loop, and the display panel may not function normally.

In S4, referring to FIG. 23, the first test may be performed on the display panel and the main flexible circuit board.

The first test including measuring the power consumption of the display panel may be taken as an example. The first test circuit 9A may be provided; and the first connection terminal 9A1 may be electrically connected to the first test point, and the second connection terminal 9A2 may be electrically connected to the second test point to perform the first test. After completing the first test, the first connection terminal 9A1 may be separated from the first test point, the second connection terminal 9A2 may be separated from the second test point, and the first test circuit may be removed.

When the first test unit 9A3 includes the first current detection device 9A4, the power consumption W of the display panel may satisfy: $W = I \cdot V_{pvdd}$, where I is the measured current value of the first current detection device 9A4, and $V_{pvdd}$ is the voltage of the external power supply.

When the first detection unit 9A3 includes the test resistor 9A6 and the first voltage detection device 9A5, the power consumption W of the display panel may satisfy:

$$W = \frac{U}{R} \cdot V_{pvdd},$$

where U is the measured voltage value of the first voltage detection device 9A5, R is the resistance value of the test resistor 9A6, and $V_{pvdd}$ is the voltage of the external power supply.

After obtaining the power consumption of the display panel, the power consumption of the display panel obtained in the first test may be compared with the designed power consumption of the display panel. If the difference between such two consumption values is less than an allowable error, it may indicate that the binding connection between the display panel and the main flexible circuit board is normal, the display panel functions normally, and subsequent formation steps of the display module may be performed. Otherwise, the formed display module may be unqualified.

In S5, referring to FIG. 23, an auxiliary flexible circuit board may be provided.

It may need to be ensured that the auxiliary flexible circuit board may include the third binding terminal and the fourth binding terminal; and the third binding terminal and the fourth binding terminal may be electrically connected with each other. Furthermore, the first binding terminal may be disposed corresponding to the third binding terminal, and the second binding terminal may be disposed corresponding to the fourth binding terminal.

In S6, referring to FIG. 23, the auxiliary flexible circuit board and the main flexible circuit board may be bound to be connected with each other.

The first binding terminal may be electrically connected with the third binding terminal, and the second binding terminal may be electrically connected with the fourth binding terminal. Since the third binding terminal is electrically connected to the fourth binding terminal, the line between the first test point and the second test point may form a complete loop in S3; and the display panel may function normally as long as the external power supply is connected.

In S7, referring to FIG. 23, the second test may be performed on the main flexible circuit board and the auxiliary flexible circuit board.

The second test including measuring the impedance of the binding connection between the main flexible circuit board and the auxiliary flexible circuit board may be taken as an example. The second test circuit 9B may be provided; and the third connection terminal 9B1 may be electrically connected to the first test point, and the fourth connection terminal 9B2 may be electrically connected to the second test point to perform the second test. After the second test is completed, the third connection terminal 9B1 may be separated from the first test point, the fourth connection terminal 9B2 may be separated from the second test point, and the second test circuit 9B may be removed. The impedance of the binding connection between the main flexible circuit board 1 and the auxiliary flexible circuit board 2 may satisfy $$R_{FOF} = \frac{U}{I},$$

where U is the voltage value measured by the second voltage detection device 9B5, and I is the current value measured by the second current detection device 9B4.

Figure 24:
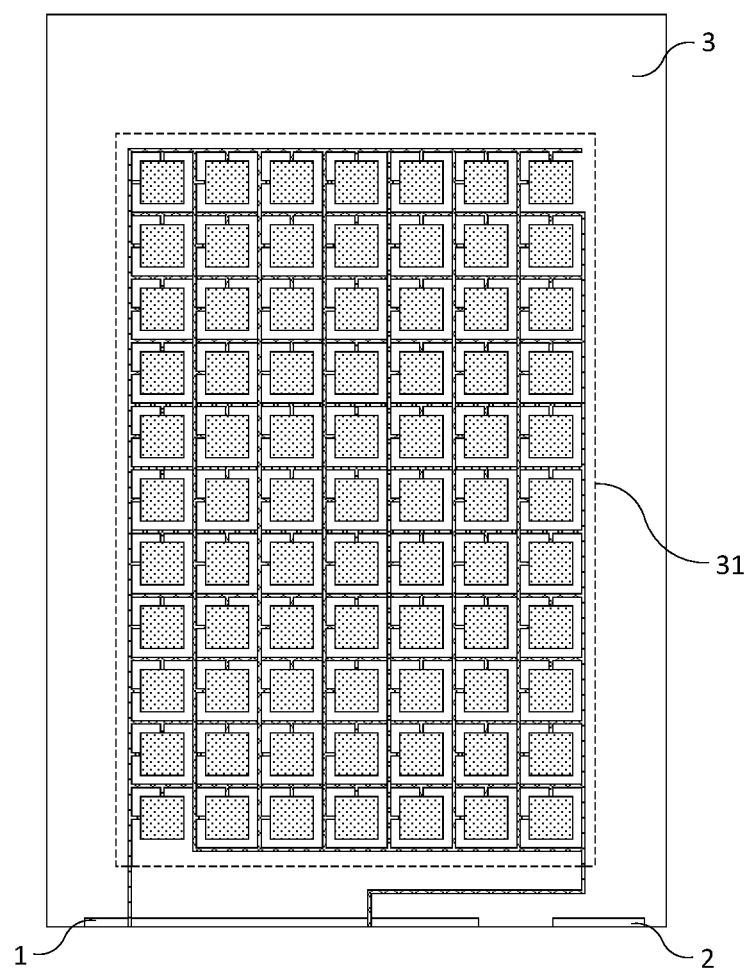
FIG. 24 illustrates a schematic of a side of a display module after the display module is folded according to various embodiments of the present disclosure.
Figure 25:
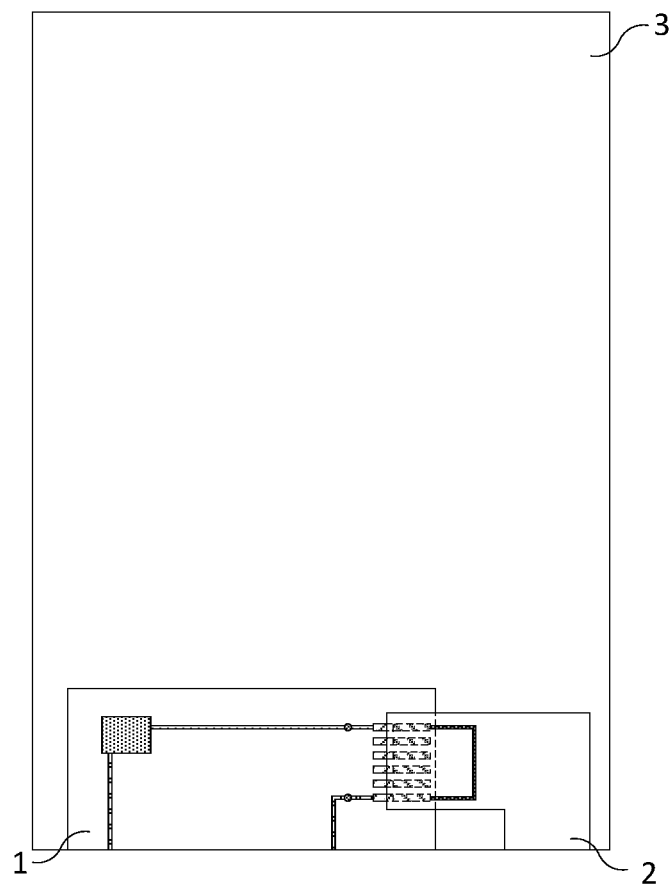
FIG. 25 illustrates a schematic of another side of the display module corresponding to FIG. 24.

FIG. 24 illustrates a schematic of a side of the display module after the display module is folded according to various embodiments of the present disclosure; and FIG. 25 illustrates a schematic of another side of the display module corresponding to FIG. 24.

After obtaining the impedance of the binding connection between the main flexible circuit board 1 and the auxiliary flexible circuit board 2, the impedance of the binding connection between the main flexible circuit board 1 and the auxiliary flexible circuit board 2 obtained in the second test may be compared with the designed impedance of the binding connection between the main flexible circuit board 1 and the auxiliary flexible circuit board 2. If the difference between such two impedance values is less than an allowable error, it may indicate that the main flexible circuit board 1 and the auxiliary flexible circuit board 2 are bound to be connected normally. Referring to FIGS. 24-25, a portion of the main flexible circuit board 1 and a portion of the auxiliary flexible circuit board 2 may be bent to the back of the display panel 3; otherwise, the formed display module may be unqualified.

From the above-mentioned embodiments, it can be seen that the flexible circuit board and the formation method of the flexible circuit board provided by the present disclosure may achieve at least the following beneficial effects.

According to the flexible circuit board and the formation method of the flexible circuit board provided by various embodiments of the present application, by disposing the first test point and the second test point, the test circuit may be directly connected to the first test point and the second test point to implement the parameter test of the flexible circuit board. During the test, the line on the flexible circuit board may not need to be cut off, which may avoid the damages of the flexible circuit board due to the line cutting.

Only some implementation manners of the present application may be described above, but the protection scope of the present application may not be limited to these implementation manners. Those skilled in the art may easily make various equivalent modifications or substitutions within the technical scope disclosed in the present application; and these modifications or substitutions should be covered within the scope of protection of the present application. The protection scope of the present application shall be subject to the protection scope of the claims.

What is claimed is:

1. A display module, comprising:
   a main flexible circuit board, including a first binding terminal, a second binding terminal, a first test point and a second test point, wherein the first test point is electrically connected to the first binding terminal, and the second test point is electrically connected to the second binding terminal;
   an auxiliary flexible circuit board, including a third binding terminal and a fourth binding terminal, wherein the third binding terminal is electrically connected to the fourth binding terminal, the first binding terminal is disposed corresponding to the third binding terminal, and the second binding terminal is disposed corresponding to the fourth binding terminal;
   a power management chip, disposed at the main flexible circuit board and configured to provide power to the display module; and
   a first wiring, wherein the first wiring includes a first signal line and a second signal line, the first test point is electrically connected to the first signal line, the first signal line is electrically connected to the power management chip, the second test point is electrically connected to the second signal line, and the second signal line is electrically connected to the power management chip.

2. The display module according to claim 1, wherein:
the display module includes a first state and a second state;
in the first state, the main flexible circuit board is separated from the auxiliary flexible circuit board; and the first test point and the second test point are configured for a first test; and
in the second state, the main flexible circuit board and the auxiliary flexible circuit board are bound to be connected with each other; the first binding terminal is electrically connected to the third binding terminal; the second binding terminal is electrically connected to the fourth binding terminal; the first test point and the second test point are configured for a second test; and the second test is different from the first test.

3. The display module according to claim 2, wherein:
the first binding terminal is multiplexed as the first test point, and the second binding terminal is multiplexed as the second test point.

4. The display module according to claim 3, wherein:
the first binding terminal includes a first electrical connection portion and a first exposed portion; and in the second state, the first exposed portion is multiplexed as the first test point, and the first electrical connection portion is electrically connected to the third binding terminal; and
the second binding terminal includes a second electrical connection portion and a second exposed portion; and in the second state, the second exposed portion is multiplexed as the second test point, and the second electrical connection portion is electrically connected to the fourth binding terminal.

5. The display module according to claim 2, wherein:
the first test point is disposed spaced apart from the first binding terminal, and the second test point is disposed spaced apart from the second binding terminal.

6. The display module according to claim 2, wherein:
the auxiliary flexible circuit board further includes an electrical connection terminal, wherein the electrical connection terminal is electrically connected to each of the third binding terminal and the fourth binding terminal.

7. A display module comprising:
a main flexible circuit board, including a first binding terminal, a second binding terminal, a first test point and a second test point, wherein the first test point is electrically connected to the first binding terminal, and the second test point is electrically connected to the second binding terminal;
an auxiliary flexible circuit board, including a third binding terminal and a fourth binding terminal, wherein the third binding terminal is electrically connected to the fourth binding terminal, the first binding terminal is disposed corresponding to the third binding terminal, and the second binding terminal is disposed corresponding to the fourth binding terminal;
a display panel, bound to be connected to the main flexible circuit board;
a power management chip, at the main flexible circuit board; and
a first wiring, wherein the first wiring includes a first signal line and a second signal line;
the first test point is electrically connected to the first signal line; the first signal line is electrically connected to the power management chip; the second test point is electrically connected to the second signal line; and the second signal line is electrically connected to the power management chip,
wherein:
the display module includes a first state and a second state;
in the first state, the main flexible circuit board is separated from the auxiliary flexible circuit board; and the first test point and the second test point are configured for a first test; and
in the second state, the main flexible circuit board and the auxiliary flexible circuit board are bound to be connected with each other; the first binding terminal is electrically connected to the third binding terminal; the second binding terminal is electrically connected to the fourth binding terminal; the first test point and the second test point are configured for a second test; and the second test is different from the first test.

8. The display module according to claim 7, wherein:
the first wiring further includes a third signal line, wherein the third signal line is electrically connected to each of the third binding terminal and the fourth binding terminal.

9. The display module according to claim 8, wherein:
the display module further includes a first non-touch-control device, configured for a first function of the main flexible circuit board; and
the main flexible circuit board further includes a fifth binding terminal, and the auxiliary flexible circuit board further includes a sixth binding terminal, wherein:
in the second state, the fifth binding terminal is electrically connected to the sixth binding terminal, the first non-touch-control device is electrically connected to the sixth binding terminal, and the first non-touch-control device is at the auxiliary flexible circuit board.

10. The display module according to claim 9, wherein:
an orthographic projection of the third binding terminal on the auxiliary flexible circuit board overlaps an orthographic projection of the electrical connection terminal on the auxiliary flexible circuit board; and an orthographic projection of the fourth binding terminal on the auxiliary flexible circuit board overlaps the orthographic projection of the electrical connection terminal on the auxiliary flexible circuit board.

11. The display module according to claim 8, in the second state, further including:
at least one fourth signal line and a first chip, wherein:
the first chip and the power management chip are electrically connected with each other via the fourth signal line; and the first chip is at the auxiliary flexible circuit board; and
projections of the fourth signal line and the first chip on a plane of the main flexible circuit board is in a region enclosed by projections of the first wiring and the power management chip on the plane of the main flexible circuit board.

12. A method for forming a display module, comprising:
providing a display panel;
providing a main flexible circuit board, including a first binding terminal, a second binding terminal, a first test point, and a second test point, wherein the first test point is electrically connected to the first binding terminal, and the second test point is electrically connected to the second binding terminal;

binding to connect the main flexible circuit board with the display panel;

performing a first test on the display panel and the main flexible circuit board, the first test includes measuring a power consumption of the display panel;

providing an auxiliary flexible circuit board;

binding to connect the auxiliary flexible circuit board with the main flexible circuit board;

performing a second test on the main flexible circuit board and the auxiliary flexible circuit board, the second test includes measuring a binding connection impedance between the main flexible circuit board and the auxiliary flexible circuit board;

disposing a power management chip at the main flexible circuit board to provide power to the display module; and disposing a first wiring including a first signal line and a second signal line, wherein the first test point is electrically connected to the first signal line, the first signal line is electrically connected to the power management chip, the second test point is electrically connected to the second signal line, and the second signal line is electrically connected to the power management chip.

13. The method according to claim 12, wherein performing the first test on the display panel and the main flexible circuit board includes:

providing a first test circuit, wherein the first test circuit includes a first connection terminal and a second connection terminal; and electrically connecting the first connection terminal with the first test point and electrically connecting the second connection terminal with the second test point to perform the first test.

14. The method according to claim 12, wherein performing the second test on the main flexible circuit board and the auxiliary flexible circuit board includes:

providing a second test circuit, wherein the second test circuit includes a third connection terminal and a fourth connection terminal; and electrically connecting the third connection terminal with the first test point and electrically connecting the fourth connection terminal with the second test point to perform the second test.

15. A display module, comprising:

a main flexible circuit board, including a first binding terminal, a second binding terminal, a first test point and a second test point, wherein the first test point is electrically connected to the first binding terminal, and the second test point is electrically connected to the second binding terminal; and an auxiliary flexible circuit board, including a third binding terminal and a fourth binding terminal, wherein the third binding terminal is directly electrically connected to the fourth binding terminal through an electrical connection terminal, the first binding terminal is disposed corresponding to the third binding terminal, and the second binding terminal is disposed corresponding to the fourth binding terminal, wherein the first test point and the second test point are electrically connected to a test circuit, to implement a parameter test of the display module before or after connecting the main flexible circuit board with the auxiliary flexible circuit board.

16. The display module according to claim 15, wherein:

the display module includes a first state and a second state;

in the first state, the main flexible circuit board is separated from the auxiliary flexible circuit board; and the first test point and the second test point are configured for a first test; and in the second state, the main flexible circuit board and the auxiliary flexible circuit board are bound to be connected with each other; the first binding terminal is electrically connected to the third binding terminal; the second binding terminal is electrically connected to the fourth binding terminal; the first test point and the second test point are configured for a second test; and the second test is different from the first test.

17. The display module according to claim 16, wherein:

the first binding terminal is multiplexed as the first test point, and the second binding terminal is multiplexed as the second test point.

18. The display module according to claim 17, wherein:

the first binding terminal includes a first electrical connection portion and a first exposed portion; and in the second state, the first exposed portion is multiplexed as the first test point, and the first electrical connection portion is electrically connected to the third binding terminal; and the second binding terminal includes a second electrical connection portion and a second exposed portion; and in the second state, the second exposed portion is multiplexed as the second test point, and the second electrical connection portion is electrically connected to the fourth binding terminal.

19. The display module according to claim 16, wherein:

the first test point is disposed spaced apart from the first binding terminal, and the second test point is disposed spaced apart from the second binding terminal.

* * * * *